(12) United States Patent
Zhang et al.

(10) Patent No.: US 10,673,231 B2
(45) Date of Patent: Jun. 2, 2020

(54) REGULATION METHOD AND DEVICE FOR CURRENT LIMITING CONTROL

(71) Applicant: Vertiv Corporation, Columbus, OH (US)

(72) Inventors: Longyun Zhang, Shenzhen (CN); Song Chen, Shenzhen (CN)

(73) Assignee: Vertiv Corporation, Columbus, OH (US)

( * ) Notice: Subject to any disclaimer, the term of this patent is extended or adjusted under 35 U.S.C. 154(b) by 0 days.

(21) Appl. No.: 15/996,986

(22) Filed: Jun. 4, 2018

(65) Prior Publication Data

US 2019/0199092 A1 Jun. 27, 2019

(30) Foreign Application Priority Data

Dec. 26, 2017 (CN) .......................... 2017 1 1430428

(51) Int. Cl.
*H02H 9/02* (2006.01)
*G05F 5/00* (2006.01)
*G01R 19/165* (2006.01)
*H03K 17/0812* (2006.01)
*H02M 1/32* (2007.01)
*H02M 3/156* (2006.01)
*H02M 3/157* (2006.01)

(52) U.S. Cl.
CPC ....... *H02H 9/025* (2013.01); *G01R 19/16571* (2013.01); *G05F 5/00* (2013.01); *H02M 1/32* (2013.01); *H02M 3/156* (2013.01); *H02M 3/157* (2013.01); *H03K 17/08122* (2013.01); *H02M 2003/1566* (2013.01)

(58) Field of Classification Search
CPC .... H02H 9/025; G01R 19/16571; G05F 5/00; H03K 17/08122
USPC ......................................................... 327/322
See application file for complete search history.

(56) References Cited

U.S. PATENT DOCUMENTS

| | | | |
|---|---|---|---|
| 8,179,114 B2 * | 5/2012 | Hirahara ............... | H02M 3/157 323/225 |
| 9,209,688 B2 * | 12/2015 | Shao ........................ | H02M 1/32 |
| 9,698,679 B2 * | 7/2017 | Jessenig ................ | H02M 3/156 |

(Continued)

OTHER PUBLICATIONS

Extended European Search Report regarding International Application No. 18176526.4 dated Jan. 17, 2019.

*Primary Examiner* — Dinh T Le
(74) *Attorney, Agent, or Firm* — Harness, Dickey & Pierce, P.L.C.

(57) ABSTRACT

A regulation method for current limiting control, comprising: S1. regulating a current limiting threshold in real time based on a current limiting action: S2. controlling switch transistors based on the regulated current limiting threshold. By implementing the regulation method and device, it is made possible to regulate a current limiting threshold in real time directly based on a current limiting action, such that a current uprush in a first PWM wave will be significantly suppressed at the time of sudden loading or occurrence of a short circuit. Further, by regulating the current limiting threshold in real time based on the current limiting action and an inductive current, it is not only made possible to satisfy proper load-carrying capability, but also made possible to prevent a current uprush in a first PWM wave from being too high at the time of sudden loading or occurrence of a short circuit.

5 Claims, 5 Drawing Sheets

(56) References Cited

U.S. PATENT DOCUMENTS

| | | | |
|---|---|---|---|
| 2007/0236199 A1* | 10/2007 | Nakata | H02M 3/1588 323/282 |
| 2014/0125303 A1* | 5/2014 | Dagan | H02M 3/156 323/282 |
| 2014/0253083 A1 | 9/2014 | Shao | |
| 2015/0311795 A1 | 10/2015 | Yang et al. | |

* cited by examiner

REGULATION METHOD AND DEVICE FOR CURRENT LIMITING CONTROL

CROSS REFERENCE TO RELATED APPLICATION

This application claims the priority of Chinese Patent Application No. 201711430428.X, entitled "REGULATION METHOD AND DEVICE FOR CURRENT LIMITING CONTROL" filed with the Chinese Patent Office on Dec. 26, 2017, which is incorporated herein by reference in its entirety.

TECHNICAL FIELD

The present invention relates to the field of current limiting techniques, and more particularly to a regulation method and device for current limiting control.

BACKGROUND ART

A current limiting technique, which is a very important protection technique in power electronic control, is related directly to the reliability of switching devices. It can effectively protect devices at the time of sudden loading or short circuit, so as to improve the impact resistance of a system. By designing an appropriate current limiting threshold point, it is made possible to ensure that: when a current exceeds the current limiting threshold point, switch transistors are timely turned off, such that the current will not continue to rise any longer, so as to achieve the object of protecting devices; and when the current falls to below the current limiting threshold point, an appropriate timing is then selected to release the control over the switch transistors, so as to continue to output a voltage, thus completing a whole current limiting process.

However, a time delay during current limiting will cause that although an actual current already reaches the set threshold point, the switch transistors cannot be timely turned off, such that the current will continue to rise to exceed the set current limiting threshold point, resulting in extra heat loss and turn-off stress. A fixed and knowable time delay can be compensated by properly decreasing the set current limiting threshold point while considering normal load-carrying capacity; however, if this time delay is changing, it is inconvenient to compensate the time delay by decreasing the current limiting threshold. Moreover, decreasing the current limiting threshold possibly will make it impossible to satisfy load-carrying capacity, and too much heat loss and turn-off pressure of the switch transistors will be caused if the current limiting threshold is selected to be too high.

SUMMARY OF THE INVENTION

The technical problem to be solved by the present invention lies in: providing, with respect to the above defects of the prior art, a regulation method and device for current limiting control which not only can satisfy proper load-carrying capacity but also can prevent a current from being too high at the time of sudden loading or occurrence of a short circuit.

The technical solution adopted by the present invention to solve its technical problem is: constructing a regulation method for current limiting control comprising:

S1. regulating a current limiting threshold in real time based on a current limiting action;

S2. controlling switch transistors based on the regulated current limiting threshold.

In the regulation method for current limiting control according to the present invention, the step S1 further comprises:

S11. regulating the current limiting threshold in real time based on the current limiting action and an inductive current.

In the regulation method for current limiting control according to the present invention, the step S1 further comprises:

S111. upon detection that no current limiting occurs and the inductive current is less than a first set value ISL, decreasing the current limiting threshold to a first current limiting threshold IPL; upon detection that the current limiting occurs or the inductive current is greater than a second set value ISH, increasing the current limiting threshold to a second current limiting threshold IPH; wherein the first set value ISL is less than the second set value ISH, the first current limiting threshold IPL is less than the second current limiting threshold IPH.

In the regulation method for current limiting control according to the present invention, the step S111 further comprises:

S1111. when the current limiting threshold is decreased to the first current limiting threshold IPL, if occurrence of current limiting is detected in a valid phase of PWM and the inductive current is greater than a third set value K*ISH in an invalid phase of the PWM, where K is a coefficient, or the inductive current is greater than the second set value ISH in both the valid phase and the invalid phase of the PWM, increasing the current limiting threshold from the first current limiting threshold IPL to the second current limiting threshold IPH;

S1112. when the current limiting threshold is increased to the second current limiting threshold IPH, if no occurrence of current limiting is detected and the inductive current is lower than the first set value ISL in the valid phase or the invalid phase of the PWM, decreasing the current limiting threshold from the second current limiting threshold IPH to the first current limiting threshold IPL.

In the regulation method for current limiting control according to the present invention, a relationship between the first set value ISL and the second current limiting threshold IPH satisfies:

$$ISL > \tfrac{1}{2} * IPH.$$

Another technical solution adopted by the present invention to solve its technical problem is: constructing a regulation device for current limiting control comprising:

a current limiting threshold regulation module for regulating a current limiting threshold in real time based on a current limiting action;

a switch transistor control module for controlling switch transistors based on the regulated current limiting threshold.

In the regulation device for current limiting control according to the present invention, the current limiting threshold regulation module is further used for regulating the current limiting threshold in real time based on the current limiting action and an inductive current.

In the regulation device for current limiting control according to the present invention, the regulation module for current limiting threshold is further used for: upon detection that no current limiting occurs and the inductive current is less than a first set value ISL, decreasing the current limiting threshold to a first current limiting threshold IPL; upon detection that current limiting occurs or the inductive current is greater than a second set value ISH, increasing the current limiting threshold to a second current limiting threshold IPH; wherein the first set value ISL is less than the second set value ISH, the first current limiting threshold IPL is less than the second current limiting threshold IPH.

In the regulation device for current limiting control according to the present invention, the current limiting threshold regulation module further comprises:

a first regulation unit for, when the current limiting threshold is decreased to the first current limiting threshold IPL, if occurrence of current limiting is detected in a valid phase of PWM and the inductive current is greater than a third set value K*ISH in an invalid phase of the PWM, where K is a coefficient, or the inductive current is greater than the second set value ISH in both the valid phase and the invalid phase of the PWM, increasing the current limiting threshold from the first current limiting threshold IPL to the second current limiting threshold IPH;

a second regulation unit for, when the current limiting threshold is increased to the second current limiting threshold IPH, if no occurrence of current limiting is detected and the inductive current is lower than the first set value ISL in the valid phase or the invalid phase of the PWM, decreasing the current limiting threshold from the second current limiting threshold IPH to the first current limiting threshold IPL.

In the regulation device for current limiting control according to the present invention, a relationship between the first set value ISL and the second current limiting threshold IPH satisfies:

$$ISL > \tfrac{1}{2} * IPH.$$

By implementing the regulation method and device for current limiting control according to the present invention, it is made possible to regulate a current limiting threshold directly based on a current limiting action, such that a current uprush in a first PWM wave will be significantly suppressed at the time of sudden loading or occurrence of a short circuit. Further, by regulating the current limiting threshold in real time based on the current limiting action and an inductive current, it is not only made possible to satisfy proper load-carrying capability, but also made possible to prevent a current uprush in a first PWM wave from being too high at the time of sudden loading or occurrence of a short circuit. Further, by decreasing the current limiting threshold when no current limiting occurs or the inductive current is very small, it is made possible to avoid a current uprush from being so much so as to exceed the capacity of the switch transistors in a current establishment process; and when current limiting already occurs or the inductive current is relatively great, the current limiting threshold is increased so as to satisfy load-carrying capacity which is three times than a peak value of a rated output current of the device, thus not only ensuring load-carrying capacity which is three times than the peak value of a rated output of the device but also making it possible to prevent the problem that a current uprush in a PWM wave is too high at the time of sudden loading or occurrence of a short circuit.

BRIEF DESCRIPTION OF THE DRAWINGS

Hereinafter, the present invention will be further described in combination with drawings and embodiments. In the drawings.

DETAILED DESCRIPTION OF THE EMBODIMENTS

To make the object, the technical solution and the advantage of the present invention more clear and explicit, the present invention will be further described in detail in combination with drawings and embodiments below. It should be understood that the specific embodiments described herein are used only to construe the present invention, but not to limit the present invention.

Figure 1:
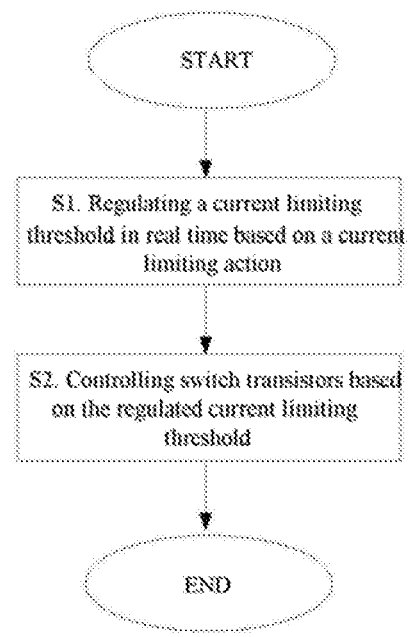
FIG. 1 is a flowchart of a first embodiment of a regulation method for current limiting control according to the present invention.

FIG. 1 is a flowchart of a first embodiment of a regulation method for current limiting control according to the present invention. As shown in FIG. 1, at step S1, a current limiting threshold is regulated in real time based on a current limiting action. At step S2, switch transistors are controlled based on the regulated current limiting threshold. In one preferred embodiment of the present invention, upon detection that no current limiting occurs, the current limiting threshold is decreased to a first current limiting threshold; upon detection that current limiting occurs, the current limiting threshold is increased to a second current limiting threshold, wherein the first current limiting threshold is less than the second current limiting threshold.

Hereinafter, the regulation method for current limiting control as shown in FIG. 1 will be described as follows. It is assumed that: ICBCSET is the initially set current limiting threshold, IPL is the first current limiting threshold, and IPH is the second current limiting threshold, IPL<IPH. Upon detection that no current limiting occurs, it is set that ICBCSET=IPL. Upon detection that current limiting occurs, it is set that ICBCSET=IPH. This state machine processing is simple and straightforward, and not only can better limit a current uprush in a first PWM wave but also can satisfy proper load-carrying capacity. By adopting the above solution, a current uprush in a first PWM wave will be significantly suppressed at the time of sudden loading or occurrence of a short circuit.

By implementing the regulation method for current limiting control according to the present invention, a current limiting threshold is regulated in real time based on a current limiting action, thus making it not only possible to satisfy proper load-carrying capability but also possible to prevent a current uprush in a first PWM wave from being too high at the time of sudden loading or occurrence of a short circuit.

Figure 2:
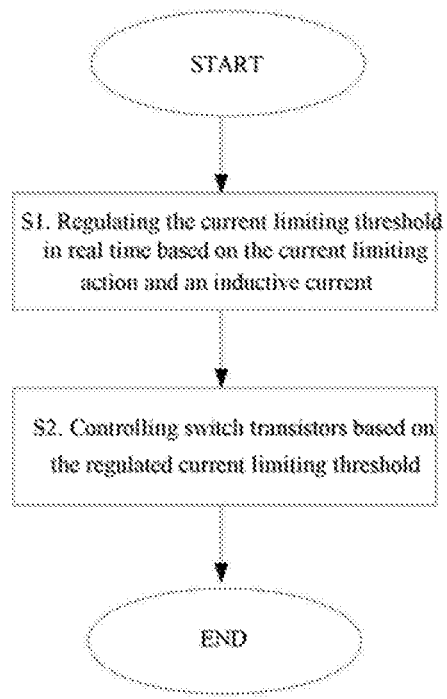
FIG. 2 is a flowchart of a second embodiment of the regulation method for current limiting control according to the present invention.

In the method as shown in FIG. 1, the processing is straightforward and simple; however, in the embodiment, the regulation of the current limiting threshold completely depends on a current limiting event, i.e., a current limiting action, which has occurred. When an inductive current IS is between the first current limiting threshold IPL and the second current limiting threshold IPH, it is possible to frequently enter and exit current limiting control. For example, in the case of loading rectifier, since the inductive current at a voltage peak is between the first current limiting threshold IPL and the second current limiting threshold IPH, current limiting control will be frequently entered and exited, and extra fluctuations and oscillations will also occur to a wave head of an output voltage. In addition, if current limiting occurs when the switch transistors are conductive, the current limiting threshold is regulated to the second current limiting threshold IPH, and thereafter the inductive current IS continuously drops to 0, then when it is necessary to turn on the switch transistors upon arrival of a next PWM effective edge, IS will also abruptly rise starting from 0, which is a current establishment process, and a delay for current sampling becomes greater; at this time, the current limiting threshold has already been regulated to the second current liming threshold IPH. The next PWM possibly cannot avoid the above defect that the current uprush is too high. In this regard, the improved technical solution as shown in FIG. 2 is further proposed. FIG. 2 is a flowchart of a second embodiment of the regulation method for current limiting control according to the present invention.

In the embodiment as shown in FIG. 2, at step S1, the current limiting threshold is regulated in real time based on the current limiting action and the inductive current. In the present embodiment, upon detection that no current limiting occurs and the inductive current is less than a first set value ISL, the current limiting threshold is decreased to a first current limiting threshold IPL; upon detection that current limiting occurs or the inductive current is greater than a second set value ISH, the current limiting threshold is increased to a second current limiting threshold IPH; wherein the first set value ISL is less than the second set value ISH, the first current limiting threshold IPL is less than the second current limiting threshold IPH. At step S2, switch transistors are controlled based on the regulated current limiting threshold.

Figure 3:
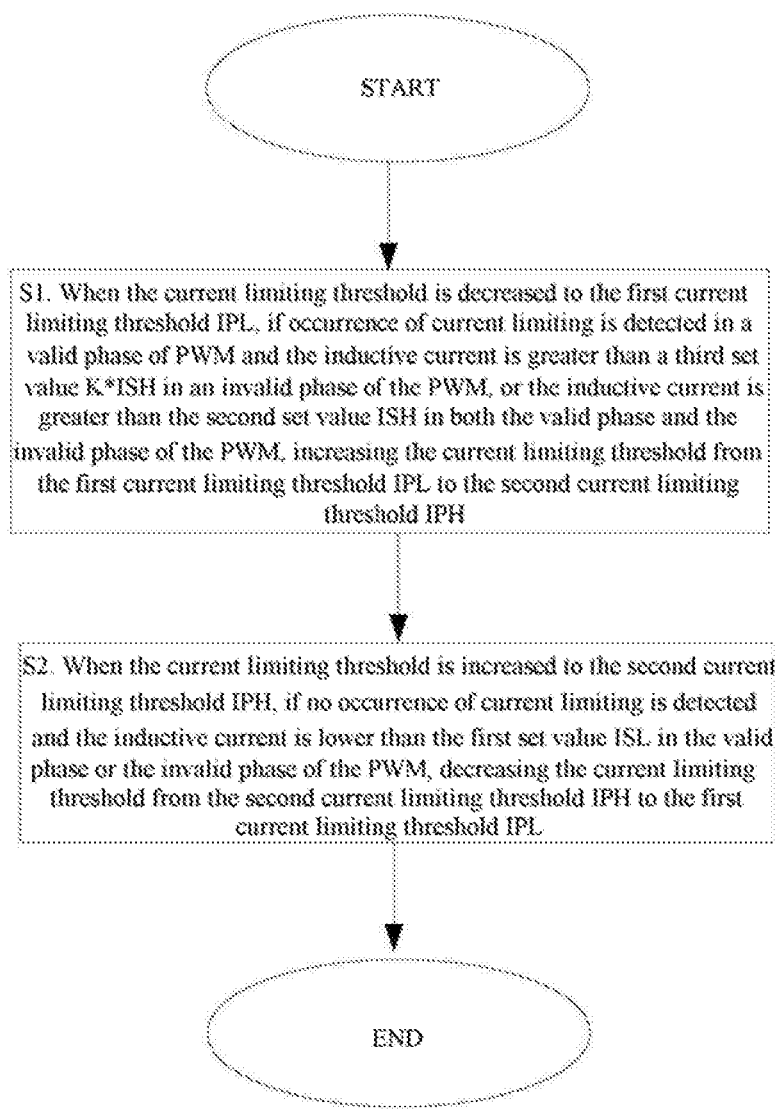
FIG. 3 is a flowchart of a preferred embodiment of the regulation method for current limiting control according to the present invention as shown in FIG. 2.

FIG. 3 is a flowchart of a preferred embodiment of the regulation method for current limiting control according to the present invention as shown in FIG. 2. As shown in FIG. 3, at step S1, when the current limiting threshold is decreased to the first current limiting threshold IPL, if occurrence of current limiting is detected in a valid phase of PWM and the inductive current is greater than a third set value K*ISH in an invalid phase of the PWM, where K is a coefficient, or the inductive current is greater than the second set value ISH in both the valid phase and the invalid phase of the PWM, the current limiting threshold is increased from the first current limiting threshold IPL to the second current limiting threshold IPH. At step S2, when the current limiting threshold is increased to the second current limiting threshold IPH, if no occurrence of current limiting is detected and the inductive current is lower than the first set value ISL in the valid phase or the invalid phase of the PWM, the current limiting threshold is decreased from the second current limiting threshold IPH to the first current limiting threshold IPL. At step S3, switch transistors are controlled based on the regulated current limiting threshold.

In the embodiment as shown in FIG. 3 below, the valid phase of PWM is a phase in which the switch transistors are required to be conductive during control; the invalid phase of the PWM is a phase in which the switch transistors are required to be off during control. In the present embodiment, it is also assumed that ICBCSET is the initially set current limiting threshold, the first current limiting threshold IPL<the second current limiting threshold IPH. In the present embodiment, the value of K may be set based on a topological structure of the switch transistors. The regulation method for current limiting control as shown in FIG. 3 will be further described as follows.

When it is set that the current limiting threshold value ICBCSET=IPL, if occurrence of current limiting is detected in a valid phase of PWM and the inductive current IS is great than K*ISH, i.e., IS>K*ISH, in an invalid phase of the PWM, or the inductive current IS is greater than the second set value ISH in both the valid phase and the invalid phase of the PWM, the current limiting threshold is increased from the first current limiting threshold IPL to the second current limiting threshold IPH. When it is set that the current limiting threshold value ICBCSET=IPH, if no occurrence of current limiting is detected and the inductive current IS is lower than the first set value ISL in the valid phase or the invalid phase of the PWM, the current limiting threshold is decreased from the second current limiting threshold IPH to the first current limiting threshold IPL. In this way, if a fluctuation of the inductive current IS exceeds an interval from the first current limiting threshold IPL to the second current limiting threshold IPH, the current limiting threshold will be frequently regulated; however, by reasonably designing this interval, it can be ensured that at the time of normal load-carrying, no actual current limiting action will occur although the current limiting threshold will be regulated. In the present invention, sampling values of the inductive current IS are generally at midpoints of a rising phase and a dropping phase of the current, the sampling of the inductive current IS are performed once at a midpoint of the valid phase of the PWM and a midpoint of the invalid phase of the PWM, respectively.

In either the valid phase or the invalid phase of the PWM, the current limiting threshold is regulated by observing the inductive current in real time. Since the current limiting threshold will also be timely regulated in the invalid phase of the PWM, it is made possible to prevent the current limiting threshold from not being timely regulated back to IPL after the falling edge of the current falls to zero, so as to avoid a large time delay occurring during a current establishment process in a next PWM cycle resulting in a current rushing too high.

Ideally, in the case of normal load-carrying, the inductive current IS drives a state machine to convert, without influencing normal load-carrying waveforms and without triggering accidental current limiting actions; in the early phase of a short circuit or suddenly loading rectifier at an output, a current limiting action drives conversion from IPL to IPH, so as to achieve the object of preventing a high current rush.

In the present embodiment, at the time of regulating the current limiting threshold to the first current limiting threshold IPL, current limiting action will be triggered wrongly, and thus normal load-carrying will not be influenced. At the time of regulating the current limiting threshold to the second current limiting threshold IPH, it is necessary to prevent Hall current from rising starting from zero, which will cause a time delay of Hall output to be too large, thus failing to keep up with the actual inductive current, such that the solution fails. After the second set value ISH is introduced, the second set threshold ISH cooperates with the first current limiting threshold IPL, such that at the time of normal load-carrying, it is ensured that current limiting threshold regulation is caused by the second set value ISH, but not by occurrence of current limiting. In this way, normal load-carrying will not be influenced.

Figure 4:
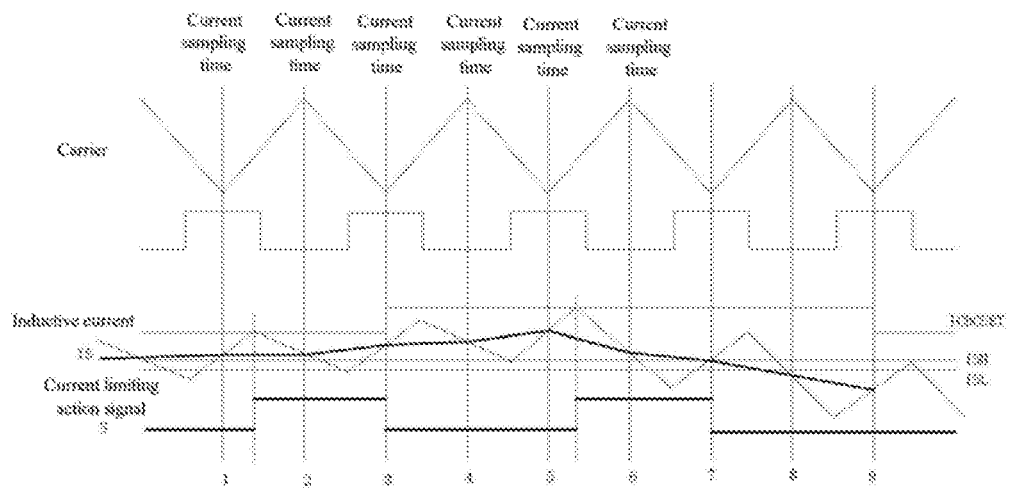
FIG. 4 is a sequence diagram when adopting the regulation method for current limiting control as shown in FIG. 3 in case of a sudden short circuit and no loading at an output.

FIG. 4 is a sequence diagram when adopting the regulation method for current limiting control as shown in FIG. 3 in case of a sudden short circuit and no loading at output. As shown in FIG. 4, a signal S representing a current limiting action being valid (i.e., becoming higher) is performed immediately, and being invalid (i.e., becoming lower) is updated once at a zero-crossing point of a carrier by taking one PWM wave as a cycle, and the regulation of the current limiting threshold also becomes valid at the zero-crossing point of the carrier. As shown in FIG. 4, prior to 1, ICBCSET=IPL; between 1 and 2, current limiting is performed, that is, the signal S representing a current limiting action is at a high level, and although a Hall time delay is large in a current establishment process, at this time the current limiting threshold is the first current limiting threshold IPL, which is a low value point, so no risk will be caused to switch devices even if the inductive current IS uprushes. At 2, the inductive current IS is great than K*ISH, i.e., IS>K*ISH. In the present embodiment, K may be set based on a topological structure of the switch transistors. At 3, the current limiting threshold is regulated from the first current limiting threshold IPL to the second current limiting threshold IPH, and ICBCSET=IPH. At this time the current limiting signal disappears, that is, no occurrence of current limiting is detected, but the inductive current IS>ISL; at this time, the current limiting threshold will not be decreased to the first current limiting threshold IPL. Between 5 and 6, the inductive current IS continues to rise and reaches the second current limiting threshold IPH; at this time occurrence of current limiting is detected, that is, the signal S representing a current limiting action is updated to a high level; at this time, the inductive current IS is not established starting from zero, the time delay is a stable value, the inductive current IS can be better limited to the second current limiting threshold IPH, and the switch transistors will also be free of risks. At 7, no occurrence of the current limiting is detected, that is, the signal S representing a current limiting action is updated to a low level. At 8, no occurrence of the current limiting is detected, the current limiting signal disappears, the signal S representing a current limiting action is at a low level, and IS<ISL. Thus at 9, the current limiting threshold is regulated to the first current limiting threshold IPL at the zero-crossing point of the carrier.

In the present embodiment, at 2, K is a sampling threshold for judgment of a falling edge when current limiting becomes valid and thus makes it necessary to regulate the current limiting threshold, and K may be set based on a topological structure of the switch transistors. For a three-level topological structure, after the main switch transistors are turned off, the bridge arm outputs a zero level, and at the time of a short circuit at the output, the external level is also zero; at this time, the inductive current IS will not drop too much, and the value of K may be selected to be larger and approximate to the first current limiting threshold IPL. For a two-level topological structure with an N line, at the time of a short circuit at the output, the level at the load side is zero; it is assumed that a short circuit occurs when the upper switch transistor is turned on, the bridge arm voltage is a positive bus voltage, the current flows towards the load side, the upper switch transistor is turned off after the current limiting action, then the bridge arm voltage is a negative bus voltage, and at this time, in comparison with the solution when the upper switch transistor is turned on, the slope of inductive current IS is almost the same, the direction of inductive current IS is opposite, and the falling of inductive current IS will also be faster, so K is required to be smaller and approximate to the second set value ISH. To prevent a current establishment process from reoccurring due to the current dropping too much in the invalid phase of PWM, it is inappropriate to select K to be less than 1. Based on the above teaching, those skilled in the art can perform a selection in regard to K according to actual requirements.

In the present embodiment, a selection in regard to the second set value ISH is appropriate if it does not influence normal loading and does not trigger a current limiting action, so a critical constraint condition for the selection in regard to ISH shall be such that: when a midpoint of an inductive current IS is sampled as being ISH, a peak value of the inductive current is right approximate to the first current limiting threshold IPL, which depends on the specific magnitude of a ripple wave of the inductive current and shall be determined in combination with actual inductance. Based on the above teaching, those skilled in the art can perform the selection in regard to the second set value ISH according to actual requirements.

Figure 5:
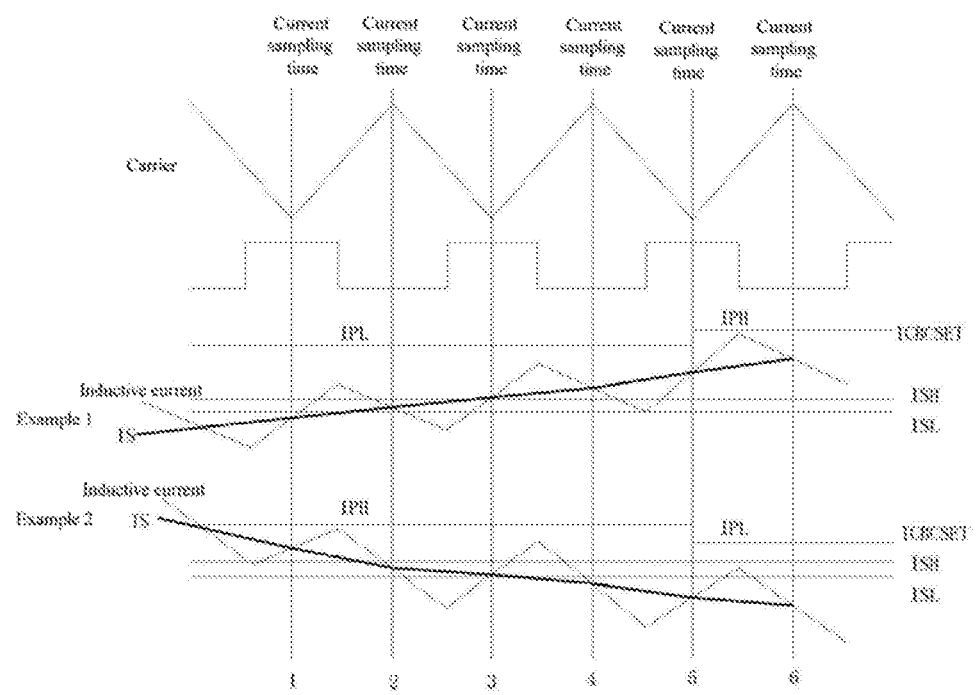
FIG. 5 is a sequence diagram when adopting the regulation method for current limiting control as shown in FIG. 3 in case of normal load-carrying.
Figure 6:
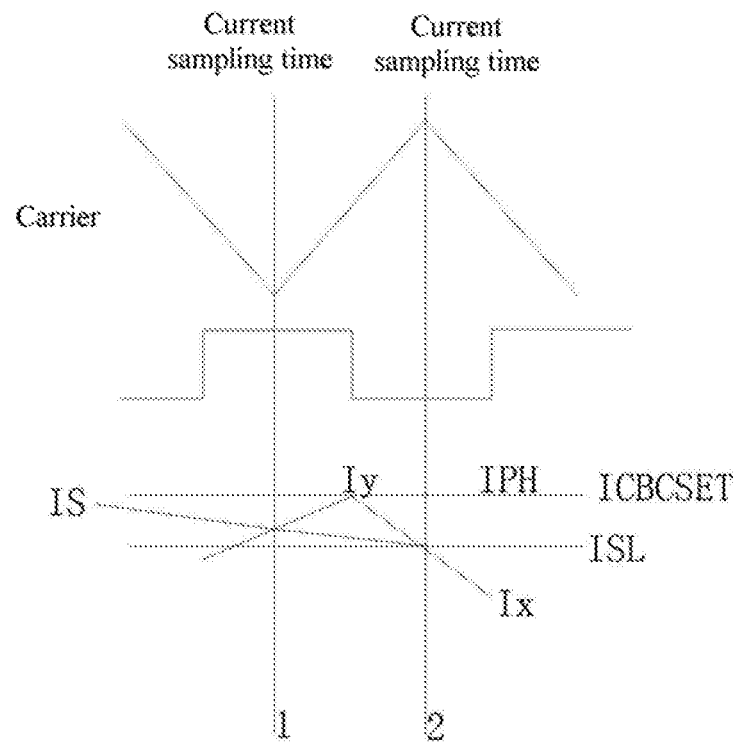
FIG. 6 is a schematic view of a selection condition of a fifth set value in the regulation method for current limiting control as shown in FIG. 3.

FIG. 5 is a sequence diagram when adopting the regulation method for current limiting control as shown in FIG. 3 in case of normal load-carrying. FIG. 6 is a schematic view of a selection condition of a fifth set value in the for current limiting control as shown in FIG. 3. Hereinafter, the selection in regard to the first set value ISL will be described in combination with FIGS. 5-6.

FIG. 5 shows two current limiting threshold regulation switching processes in case of normal load-carrying. As shown in FIG. 5, sampling is performed at a zero-crossing point and a cycle point of a carrier, and a median of the inductive current are sampled as the inductive current IS. If the PWM is high, it is at a valid level, the switch transistors are conductive, and the inductive current IS rises; otherwise, the PWM is at a low level, and the inductive current IS drops. In the present embodiment, it is assumed that: ICBCSET is the initially set current limiting threshold, IPL is the first current limiting threshold, and IPH is the second current limiting threshold, IPL<IPH. ISH is the second set value, K*ISH is the third set value, and ISL is the first set value. FIG. 5 only shows that the regulated current limiting threshold ICBCSET becomes valid at a next carrier zero-crossing point, the resultant current limiting signal immediately becomes valid, and is updated once at the carrier zero-crossing point within one PWM cycle if it is invalid.

With regard to Example 1 in FIG. 5, the initially set current limiting threshold is set as such that ICBCSET=IPL, no occurrence of current limiting is detected at 1 and 2, the inductive current IS does not exceed the third set value ISH either, and the current limiting threshold is maintained at the first current limiting threshold IPL. At 3, in the valid phase of the PWM, it is detected that the inductive current IS is greater than the second set value ISH; and at 4, in the invalid phase of the PWM, IS is also greater than the second set value ISH, then at a next zero-crossing point 5 of the carrier, the current limiting threshold is set as such that ICBCSET=the second current limiting threshold IPH, thus completing the regulation of the current limiting threshold in the rising phase of the current.

In Example 2 in FIG. 5, the initially set current limiting threshold is set as such that ICBCSET=IPH, no occurrence of current limiting is detected at points 1 and 2, but the current limiting threshold will not be regulated lower to the first current limiting threshold IPL since the inductive current IS is greater than the first set value ISL. At 4, in the invalid phase of the PWM, the inductive current IS is less than the first set value ISL, and at a next zero-crossing point 5 of the carrier, the current limiting threshold is regulated to the first current limiting threshold IPL, thus completing the regulation of the current limiting threshold in the falling phase of the current.

In Example 2 in FIG. 5, since judgment is also performed on the inductive current IS in the invalid phase, by reasonably selecting the first set value ISL, the current can be avoided from falling too much in the falling phase of the inductive current. FIG. 6 is a schematic view of a selection condition of a fifth set value in the regulation method for current limiting control as shown in FIG. 3.

It is assumed that the inductive current IS sampled at the midpoint of the invalid phase of the PWM is IS=ISL, and that the inductive current IS falls from Iy to Ix in the invalid phase of the PWM, and it is assumed that inductance of an inductor is not changed, and that a voltage drop across the inductor is also not changed. Then the following equation exists:

$$Iy-ISL=ISL-Ix \quad (1)$$

If Ix=0, when a next PWM valid phase comes, the Hall current output is established starting from zero, and the time delay will be larger. Thus it is necessary to ensure:

$$Ix>0 \quad (2)$$

As can be seen from formula (1):

$$Ix=2*ISL-Iy \quad (3)$$

As can be obtained from formulae (2) and (3):

$$2*ISL-Iy>0 \quad (4)$$

That is:

$$ISL>\tfrac{1}{2}*Iy \quad (5)$$

Due to transitioning from a non-current limiting state and preparing to regulate the current limiting threshold to be lower, Iy is IPH at most. Then the following exists:

$$ISL>\tfrac{1}{2}*IPH \quad (6)$$

Therefore, formula (6) is a relative constraint condition of the selection of the first set value ISL and the second current limiting threshold IPH. During actual applications, since the inductance is larger if the current is smaller, the falling from Iy to Ix is non-linear, and the current drops slower when it gets closer to Ix. The selection according to the condition shown in formula (6) can ensure Ix to be greater than zero.

Of course, in other preferred embodiments of the present invention, the first set value ISL may also be selected based on other methods. For example, ISL may also be selected according to a current PWM duty cycle as well as a bus voltage and an output voltage, or by estimating whether or not Ix will fall to a zero zone.

By implementing the regulation method for the current limiting control according to the present invention, the current limiting threshold is regulated in real time based on the current limiting action and an inductive current, thus not only making it possible to satisfy proper load-carrying capability but also making it possible to prevent a current uprush in a first PWM wave from being too high at the time of sudden loading or occurrence of a short circuit. Further, by decreasing the current limiting threshold when no current limiting occurs or the inductive current is very small, it is made possible to avoid a current uprush from being so much so as exceed the capacity of the switch transistors in a current establishment process: and when current limiting already occurs or the inductive current is relatively great, the current limiting threshold is increased so as to satisfy load-carrying capacity which is three times than the peak value of a rated output current of the device, thus not only ensuring load-carrying capacity which is three times than the peak value of a rated output of the device but also making it possible to prevent the problem that a current uprush in a PWM wave is too high at the time of sudden loading or occurrence of a short circuit.

Figure 7:
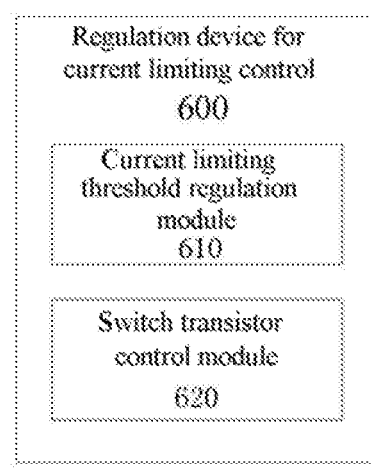
FIG. 7 is a principle block diagram of a first embodiment of a regulation device for current limiting control according to the present invention.

FIG. 7 is a principle block diagram of a first embodiment of a regulation device for a current limiting control according to the present invention. As shown in FIG. 7, the regulation device for current limiting control 600 according to the present invention comprises a current limiting threshold regulation module 610 and a switch transistor control module 620. As shown in FIG. 7, the current limiting threshold regulation module 610 is used for regulating a current limiting threshold in real time based on a current limiting action. The switch transistor control module 620 is used for controlling switch transistors based on the regulated current limiting threshold. The current limiting threshold regulation module 610 may be further used for: upon detection that no current limiting occurs and the inductive current is less than a first set value, decreasing the current limiting threshold to a first current limiting threshold IPL; upon detection that the current limiting occurs or the inductive current is greater than a second set value, increasing the current limiting threshold to a second current limiting threshold.

As appreciated by those skilled in the art, the current limiting threshold regulation module 610 and the switch transistor control module 620 according to the present invention may be constructed based on the current limiting control method of a three-level inverter as shown in FIG. 1, which will not be repeatedly described herein.

By implementing the regulation device for the current limiting control according to the present invention, the current limiting threshold is regulated in real time based on the current limiting action and an inductive current, thus not only making it possible to satisfy proper load-carrying capability but also making it possible to prevent a current uprush in a first PWM wave from being too high at the time of sudden loading or occurrence of a short circuit.

Figure 8:
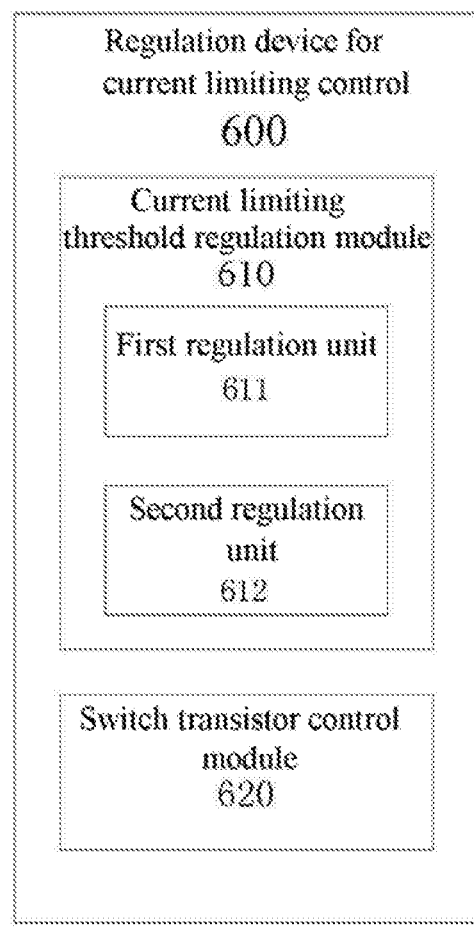
FIG. 8 is a principle block diagram of a second embodiment of the regulation device for current limiting control according to the present invention.

FIG. 8 is a principle block diagram of a second embodiment of the regulation device for current limiting control according to the present invention. As shown in FIG. 8, the regulation device for the current limiting control 600 according to the present invention comprises a current limiting threshold regulation module 610 and a switch transistor control module 620. Further as shown in FIG. 8, the current limiting threshold regulation module 610 further comprises a first regulation unit 611 and a second regulation unit 612. As shown in FIG. 8, the first regulation unit 611 is used for, when the current limiting threshold is decreased to the first current limiting threshold IPL, if occurrence of current limiting is detected in a valid phase of PWM and the inductive current is greater than a third set value K*ISH in an invalid phase of the PWM, or the inductive current is greater than the second set value ISH in both the valid phase and the invalid phase of the PWM, increasing the current limiting threshold from the first current limiting threshold IPL to the second current limiting threshold IPH. The second regulation unit 612 is used for, when the current limiting threshold is increased to the second current limiting threshold IPH, if no occurrence of current limiting is detected and the inductive current is lower than the first set value ISL in the valid phase or the invalid phase of the PWM, decreasing the current limiting threshold from the second current limiting threshold IPH to the first current limiting threshold IPL. The switch transistor control module 620 is used for controlling switch transistors based on the regulated current limiting threshold.

As appreciated by those skilled in the art, the current limiting threshold regulation module 610 and the switch transistor control module 620, as well as the first regulation unit 611 and the second regulation unit 612 according to the present invention may be constructed based on the current limiting control methods of a three-level inverter as shown in FIGS. 3-6, which will not be repeatedly described herein.

By implementing the regulation device for the current limiting control according to the present invention, the current limiting threshold is regulated in real time based on the current limiting action and an inductive current, thus not only making it possible to satisfy proper load-carrying capability but also making it possible to prevent a current uprush in a first PWM wave from being too high at the time of sudden loading or occurrence of a short circuit. Further, by decreasing the current limiting threshold when no current limiting occurs or the inductive current is very small, it is made possible to avoid a current uprush from being so much so as exceed the capacity of the switch transistors in a current establishment process; and when current limiting already occurs or the inductive current is relatively great, the current limiting threshold is increased so as to satisfy load-carrying capacity which is three times than the peak value of a rated output current of the device, thus not only ensuring load-carrying capacity which is three times than the peak value of a rated output current of the device but also making it possible to prevent the problem that a current uprush in a PWM wave is too high at the time of sudden loading or occurrence of a short circuit.

The foregoing are only optimal embodiments of the present invention, but are not used to limit the present invention. Any modification, equivalent substitution and improvement and the like made within the spirit and principle of the present invention should be contained in the scope of protection of the present invention. Moreover, although the present disclosure has been shown and described with respect to one or more implementations, those skilled in the art would conceive of equivalent variants and modifications upon reading and understanding the Description and the Drawings. The present disclosure includes all such modifications and variants, and is limited only by the scope of the appended claims. Particularly with regard to the various functions implemented by the above devices, modules or units, terms for describing such devices, modules or units aim to correspond to any device, module or unit that implements the specified functions of the devices, modules or units (for example they are equivalent in terms of functions), unless otherwise indicated, even if they are not equivalent to the disclosed structures that implement the functions in the exemplary implementations of the present disclosure as shown in this text. In addition, although the specified features of the present disclosure have been disclosed with respect to only one of several implementations, such features may be combined with for example one or more other features of other implementations which could be desired and advantageous for given or specific applications.

The various devices, modules or units in the embodiments of the present invention may be integrated in one device, module or unit, and may also be individually separate physical existences, and it is also possible that two or more devices, modules or units are integrated in one device, module or unit. The foregoing integrated devices, modules or units may be realized either in the form of hardware or in the form of software functional modules. If the integrated devices, modules or units are realized in the form of software functional modules and are sold or used as independent products, they may also be stored in a computer readable storage medium. The aforementioned storage medium may be an RAM, a magnetic disk or an optical disk or the like. The foregoing devices, apparatuses or systems may implement the methods in the corresponding method embodiments.

The foregoing are only optimal embodiments of the present invention, but are not used to limit the present invention. Any modification, equivalent substitution and improvement and the like made within the spirit and principle of the present invention should be contained in the scope of protection of the present invention.

What is claimed is:

1. A regulation method for current limiting control, comprising:
    step S1: adjusting a current limiting threshold in real time, wherein the adjusting includes detecting a present current and, based on the present current:
        upon detection that no current limiting occurs and an inductive current is less than a first set value, decreasing the current limiting threshold to a first current limiting threshold;
        upon detection that the current limiting occurs or the inductive current is greater than a second set value, increasing the current limiting threshold to a second current limiting threshold, wherein the first set value is less than the second set value, the first current limiting threshold is less than the second current limiting threshold;
        when the current limiting threshold is decreased to the first current limiting threshold, if occurrence of current limiting is detected in a valid phase of PWM and the inductive current is greater than a third set value K*ISH in an invalid phase of the PWM, where K is a coefficient and ISH represents the second set value, or the inductive current is greater than the second set value in both the valid phase and the invalid phase of the PWM, increasing the current limiting threshold from the first current limiting threshold to the second current limiting threshold; and
        when the current limiting threshold is increased to the second current limiting threshold, if no occurrence of current limiting is detected and the inductive current is lower than the first set value in the valid phase or the invalid phase of the PWM, decreasing the current limiting threshold from the second current limiting threshold to the first current limiting threshold; and
    step S2: controlling switch transistors based on the adjusted current limiting threshold.

2. The regulation method for current limiting control according to claim 1, characterized in that a relationship between the first set value and the second current limiting threshold satisfies:

$$ISL > \tfrac{1}{2} * IPH,$$

wherein ISL represents the first set value and IPH represents the second current limiting threshold.

3. A regulation device for current limiting control, comprising:
    a current limiting threshold regulation module for adjusting a current limiting threshold in real time according to control instructions, wherein the control instructions include detecting a present current and, based on the present current:
- upon detection that no current limiting occurs and an inductive current is less than a first set value, decreasing the current limiting threshold to a first current limiting threshold;
- upon detection that current limiting occurs or the inductive current is greater than a second set value, increasing the current limiting threshold to a second current limiting threshold, wherein the first set value is less than the second set value, the first current limiting threshold is less than the second current limiting threshold;
- when the current limiting threshold is decreased to the first current limiting threshold, if occurrence of current limiting is detected in a valid phase of PWM and the inductive current is greater than a third set value K*ISH in an invalid phase of the PWM, where K is a coefficient and ISH represents the second set value, or the inductive current is greater than the second set value in both the valid phase and the invalid phase of the PWM, increasing the current limiting threshold from the first current limiting threshold to the second current limiting threshold; and
- when the current limiting threshold is increased to the second current limiting threshold, if no occurrence of current limiting is detected and the inductive current is lower than the first set value in the valid phase or the invalid phase of the PWM, decreasing the current limiting threshold from the second current limiting threshold to the first current limiting threshold; and
- a switch transistor control module for controlling switch transistors based on the adjusted current limiting threshold.

4. The regulation device for current limiting control according to claim 3, characterized in that a relationship between the first set value and the second current limiting threshold satisfies:

$$ISL > \tfrac{1}{2} * IPH,$$

wherein ISL represents the first set value and IPH represents the second current limiting threshold.

5. A method for limiting current by adjusting a current threshold, the method comprising:
- in response to a present current being unaffected by the current threshold and an inductive current being less than a first set value, decreasing the current threshold to a first current threshold;
- in response to the present current being limited or the inductive current being greater than a second set value, increasing the current threshold to a second current threshold, wherein the first set value is less than the second set value and the first current threshold is less than the second current threshold;
- in response to the current threshold being decreased to the first current threshold, increasing the current threshold from the first current threshold to the second current threshold if:
  - the current threshold being decreased is detected in a valid phase of PWM, where K is a coefficient and ISH represents the second set value; or
  - the inductive current is greater than the second set value in both the valid phase and an invalid phase of the PWM; and
- in response to the current threshold being increased to the second current threshold, decreasing the current threshold from the second current threshold to the first current threshold if the present current is unaffected by the second current threshold and the inductive current is lower than the first set value in the valid phase of the invalid phase of the PWM; and
- controlling switch transistors to prevent the present current from exceeding the current threshold.

* * * * *